United States Patent
Grynewicz et al.

(10) Patent No.: US 11,764,834 B2
(45) Date of Patent: Sep. 19, 2023

(54) DEVICE FOR AND METHOD OF SYNCHRONIZING MULTIPLE BEAMFORMING DEVICES

(71) Applicant: Raytheon Company, Waltham, MA (US)

(72) Inventors: Michael P. Grynewicz, Trinity, FL (US); Allen Andreu, Tampa, FL (US)

(73) Assignee: Raytheon Company, Waltham, MA (US)

( * ) Notice: Subject to any disclaimer, the term of this patent is extended or adjusted under 35 U.S.C. 154(b) by 18 days.

(21) Appl. No.: 17/651,124

(22) Filed: Feb. 15, 2022

(65) Prior Publication Data
US 2023/0261700 A1   Aug. 17, 2023

(51) Int. Cl.
  *H04B 7/0408*   (2017.01)
  *H04L 7/033*   (2006.01)

(52) U.S. Cl.
  CPC ........... *H04B 7/0408* (2013.01); *H04L 7/033* (2013.01)

(58) Field of Classification Search
  CPC ..... G06F 1/00; G06F 1/08; G06F 1/12; H03L 7/06; H03L 7/07; H03L 7/093; H03L 7/099; H03K 5/01; H03K 5/14; H04L 1/00; H04L 7/00; H04L 1/033; H04L 1/0408
  USPC ....... 375/130, 219, 260, 267, 295–297, 316, 375/327; 327/141, 145, 147, 156
  See application file for complete search history.

(56) References Cited

U.S. PATENT DOCUMENTS

| | | |
|---|---|---|
| 6,434,706 B1 | 8/2002 | Jensen et al. |
| 7,382,844 B2 | 6/2008 | Hwang et al. |
| 7,495,516 B2 | 2/2009 | Travis |
| 7,865,165 B2 | 1/2011 | Robinson et al. |
| 8,089,318 B2 | 1/2012 | Yeung et al. |

(Continued)

FOREIGN PATENT DOCUMENTS

| | | |
|---|---|---|
| CN | 111565046 A | 8/2020 |
| DE | 10-2016-109387 A1 | 12/2016 |

OTHER PUBLICATIONS

Texas Instruments, "Synchronized Multi-Transmitter Design: Method of Time-Aligning Multiple DAC3Xj8xs in JESD204B Environment;" TI Designs; Data Sheet; Mar. 2016; 28 Pages.

(Continued)

*Primary Examiner* — Shawkat M Ali
(74) *Attorney, Agent, or Firm* — DALY CROWLEY MOFFORD & DURKEE, LLP (57) ABSTRACT

Described herein is a method and apparatus for a multi-beam digital system including a frequency reference device having an output for providing a frequency reference signal; a fanout device connected to the frequency reference device and configured to generate n frequency reference signals from the frequency reference signal output from the frequency reference device, having n outputs configured to output the n frequency reference signals, respectively, where n is a positive integer; n local clock domain devices configured to synchronize the n frequency reference signals and distribute reference and clock signals having deterministic phase and phase/data alignment; and n beamforming devices connected to the n local clock domain devices, respectively, and configured to form a user-definable beam, and having n input configured to receive n radio frequency (RF) signals, and n outputs for transmitting n RF signals.

20 Claims, 8 Drawing Sheets

(56) References Cited

U.S. PATENT DOCUMENTS

| | | | |
|---|---|---|---|
| 8,312,309 | B2 | 11/2012 | Hendrickson et al. |
| 9,037,893 | B2 | 5/2015 | Holford et al. |
| 9,077,512 | B2 | 7/2015 | Olejarz et al. |
| 9,564,913 | B1 | 2/2017 | Courcy |
| 9,871,504 | B2 | 1/2018 | Clara et al. |
| 10,177,897 | B2 | 1/2019 | Schell et al. |
| 10,430,372 | B2 | 10/2019 | Jeon et al. |
| 10,461,753 | B1 | 10/2019 | Pritchard et al. |
| 10,509,104 | B1 | 12/2019 | Dato |
| 10,877,509 | B2 | 12/2020 | Christiansen |
| 11,212,016 | B1* | 12/2021 | Kaluzni ............... H04B 17/14 |
| 2014/0176215 | A1 | 6/2014 | Ahmed et al. |
| 2018/0317188 | A1 | 11/2018 | Stager et al. |
| 2019/0372218 | A1* | 12/2019 | Vehovc ............... H04B 17/12 |
| 2021/0356985 | A1 | 11/2021 | Wei |

OTHER PUBLICATIONS

Xie et al., "Application of Synchronous Acquisition Technology Based on JESD204B Protocol in Phased Array Radar;" 2018 11$^{th}$ International Congress on Image and Signal Processing, BioMedical Engineering and Informatics (CISP-BMEI 2018); Oct. 13, 2018; 5 Pages.

PCT International Search Report and Written Opinion dated Apr. 4, 2023 for the International Application No. PCT/2022/051137; 24 Pages.

Jones et al., "Power-Up Phase Determinism Using Multichip Synchronization Features in Integrated Wideband DACs and ADCs;" Technical Article from Analog Devices; Mar. 23, 2021; 9 Pages.

Klumsde, "Getting in Synch with RF Data Converters;" Retrieved from https://www.xilinx.com/applications.html; Oct. 13, 2021; 8 Pages.

Mullins et al., "Demystifying Data-Driven and Pausible Clocking Schemes;" 13th IEEE International Symposium on Asynchronous Circuits and Systems (ASYNC'07); Mar. 12, 2007; 11 Pages.

Toroni, "Multi-Clock Synchronization;" Application Report SNAA294 from Texas Instruments; Dec. 2019; 14 Pages.

Toroni, "Synchronizing Multiple LMK0482x Devices, or Providing More JESD204B Outputs than a Single LMK0482x Device Allows;" Article by Texas Instruments; Pre-release Version Jan. 23, 2019; 57 Pages.

* cited by examiner

DEVICE FOR AND METHOD OF SYNCHRONIZING MULTIPLE BEAMFORMING DEVICES

BACKGROUND

There are system architectural challenges for establishing phase alignment and determinism across independent local clock domains of radio frequency (RF) data converters on multiple components (e.g., Xilinx RF System on Chip (RFSoc) boards) for real-time data links for a phase-coherent, digital, multi-beam array system.

For example, Xilinx's third generation RFSoC enables direct sampling of C-band energy. RFSoCs with embedded analog to digital converter (ADC) and digital to analog converter (DAC) channels require tight synchronization to ensure coherent operations for beamforming applications. Sampling in the Giga-Samples-Per-Second (GSPS) domain timing synchronization amongst RF data converters on a single integrated circuit (e.g., chip) are accomplished but the challenge becomes intensified to achieve synchronization of sampling clocks and sample data alignment across multiple RFSoCs. Multi-Chip Synchronization (MCS) enabling coherent operation requires sampling clock alignment to within one sampling clock period (T1).

Issues concerning MCS are described in articles "Getting in Synch with RF Data Converters," klumsde, Oct. 13, 2021; "Power-Up Phase Determinism Using Multichip Synchronization Features in Integrated Wideband DACs and ADCs," Mike Jones et al., 2021; "Multi-Clock Synchronization," Timothy Toroni, December 2019, and "Synchronizing multiple LMK0482x devices or providing more JESD204B outputs than a single LMK0482x device allows," Timothy Toroni, Jan. 23, 2019. However, conventional devices do not provide a comprehensive guide on synchronizing multiple RFSoCs.

SUMMARY

In accordance with the concepts described herein, example multi-device synchronization devices and methods are provided that configure local clock domains of multiple RF sampling devices thereby, establishing a coherent digital antenna for digital beamforming application. Established is a clocking tree architecture that distributes a stable frequency reference to local clock domains and establishes a sequence for multiple device initialization of numerically controlled oscillators, dividers, and RF data converter multi-device synchronization.

In accordance with the concepts described herein, an example digital, multi-beam system is provided for real-time RF data links.

In accordance with the concepts described herein, an example digital, multi-beam system provides phase alignment using a clocking scheme configured as JESD204B Subclass 0 with local clock domain devices configured for zero-delay mode (ZDM) and an initialization scheme to reset NCOs, dividers, and multi-device synchronization of sample data capture. JESD204B Subclass 0 is a standardized serial interface between data converters (e.g., analog to digital converters (ADCs) and digital to analog converters (DACs)) and logic devices (e.g., field programmable gate arrays (FPGAs) or application specific integrated circuits (ASICs)), where serial data rates are up to 12.5 Gbps, and where a mechanism is provided to achieve deterministic latency across the serial link.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

An embodiment of the present disclosure provides a multi-beam array system that aligns clock signals and data samples between multiple clock domains (e.g., multiple RFSoC boards) and initializes and synchronizes multiple integrated circuits between multiple clock domains to create deterministic alignment for improved performance of the multi-beam array system.

In an embodiment, a single tone is injected into multiple ADCs across multiple clock domains. Phase offset between sampling clocks leads to phase error in a received signal. Phase alignment between sampling clocks captures a received signal "as is."

The present disclosure concerns a scalable and composable multi-beam digital array system (e.g., a C-band digital array antenna). An example architecture for a C-band digital array is capable of forming multiple beams simultaneously. The present disclosure applies to robust tactical data communication links (e.g., frequency hopping, near real time, narrow band communications, etc.). Design considerations for the present disclosure include the number of beams, system timing, and total number of elements. An embodiment of the present disclosure may include a uniform linear array (e.g., 8 elements split between multiple RFSoCs), two RFSoCs (e.g., Xilinx's RFSoC Gen 3 ZCU208 evaluation modules (EVMs), high-speed Gbps serializer/deserializer (SERDES) data plan, low voltage differential signaling (LVDS) a field programmable gate array (FPGA) mezzanine card (FMC) data capture trigger, a chip-scale atomic clock (CSaC), and a reference fanout device.

An embodiment of the present disclosure provides a digital, multi-beam system that determines phase error and corrects phase error to ensure digital beam former coherency utilizing RF analog chain phase deltas (e.g., changes over frequency). Sampling clock timing skew deltas between RFSoCs are independent of RF analog frequency. The skew of a sampling clock for data converters (DCs) in the same clock domain is negligible. The skew between multi-domain (e.g., multi-board) clocking domains is analyzed to determine margin. Radiated orthogonal calibration may be utilized to calibrate all error without bias.

An embodiment of the present disclosure provides a digital, multi-beam system that synchronizes multiple independent clock domains using phase-locked loop/synthesizer/distribution device dividers and a system reference clock (SYSREF). A device mode configuration ensures deterministic phase between SYSREF and other clock signals (CLKs), count initialization of a numerically-controlled oscillator (NCO), alignment and determinism (e.g., relative latency across channels in the same clock domain, and consistent total latency at start-up). Configuring clock devices in zero delay mode (ZDM) establish phase determinism between a reference and device clock outputs. A SYSREF stream may be used for multi-device synchronization and a SYSREF pulse may be used for resetting NCO counts. A calibration injection signal is used to measure relative phase error deltas (e.g., contributed by both RF manifold and relative sampling clock skew) between data converters and calculate digital adjustments in the form of weights to be applied to the data from each data converter thereby providing phase alignment. An array processor may align multiple RFSoCs with respect to sample alignment with a first-in-first-out (FIFO) reset trigger signal.

Relative sampling clock offsets are additive to phase error of the incoming RF signal. The differences in components between the different channels in the RF manifold contribute phase error that is frequency dependent. Additive specifically from the phase error of the RF manifold and the relative sampling clock offsets between channels.

Requirements for coherent digital beamforming (DBF) for multiple clock domains (e.g., multiple RFSoCs) may include reference and sampling clock phase alignment, commonly referred to as multi-chip synchronization (MCS), and partial beam stream sample alignment during interchange. Achieving MCS requires an understanding of the sources of latency mismatch across clock domain devices (e.g., RFSoC devices), multi-clock synchronization methods, multi-device synchronization, a deterministic SYSYREF clock between clocking devices, and phase determinism on power up.

Figure 1A:
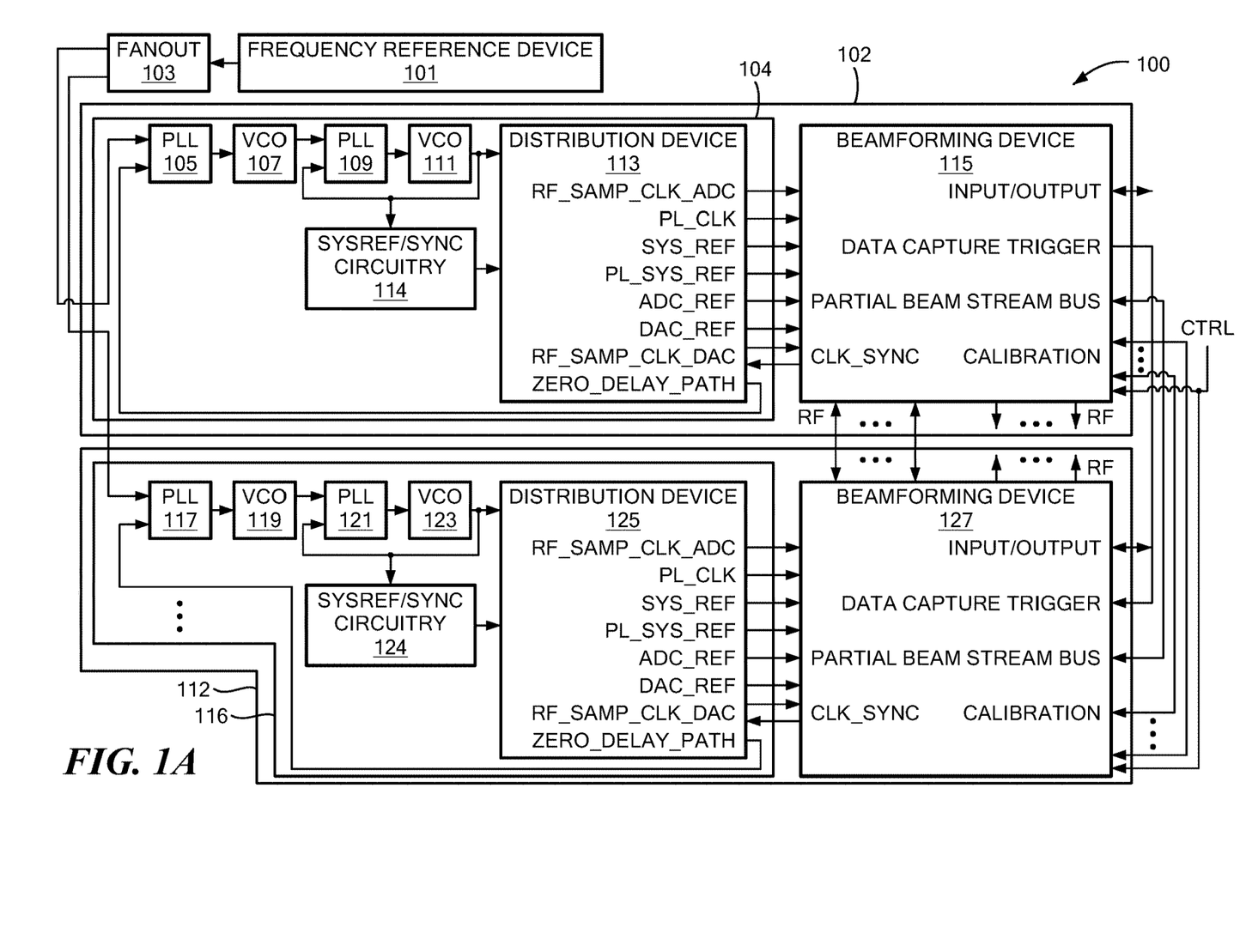
FIG. 1A is an illustration of a digital multi-beam system of an embodiment of the concepts described herein.

FIG. 1A is an illustration of a multi-beam system 100 of an embodiment of the concepts described herein.

In example embodiments, the multi-beam system 100 includes a frequency reference device 101 having an output at which a reference sine wave signal (e.g., an undisciplined 10 MHz sine wave) is provided. In an embodiment of the present disclosure, the frequency reference device 101 may comprise a chip-scale atomic clock (CSAC) as the frequency reference.

In the illustrated embodiment, the output of the frequency reference device 101 is connected to an input of a fanout device 103, which may comprise a 1 to n fanout device, where n is a positive integer. In an exemplary embodiment of the present disclosure, a fanout is two. However, the present disclosure is not limited thereto. Each output of the fanout device 103 provides a frequency reference signal equivalent to the frequency reference signal received by the fanout device 103 from the frequency reference device 101. In an exemplary embodiment of the present disclosure, the fanout device 103 may comprise a dual phase-locked loop (PLL) and clock cleaner distribution integrated circuit (e.g., Texas Instruments commercial component number LMK03328).

Each output of the fanout device 103 provides a frequency reference signal for one of multiple beamforming channel devices 102 and 112 of the multi-beam system 100. FIG. 1A illustrates two beamforming channel devices 102 and 112 corresponding to the two outputs of the fanout device 103. However, the present disclosure is not limited thereto. In an exemplary embodiment of the present disclosure, there may be as many as n beamforming channel devices corresponding to the maximum number of n frequency reference signals provided by the fanout device 103, where n is a positive integer.

A first output of the fanout device 103 provides a frequency reference signal to a first local clock domain 104 comprising a first PLL 105, a first voltage-controlled oscillator (VCO) 107, a second PLL 109, a second VCO 111, a first SYSREF/SYNC circuitry device 114, and a first distribution device 113. A first beamforming channel device 102 includes the first local clock domain 104 (i.e., the first PLL 105, the first VCO 107, the second PLL 109, the second VCO 111, the first SYSREF/SYNC circuitry device 114, the first distribution device 113) and a first beamforming device 115.

The first PLL 105 receives a distributed frequency reference signal from the first output of the fanout device 103 and a feedback signal SYSREF from the first distribution device 113, establishing a ZERO_DELAY_MODE configuration. An output of the first PLL 105 is connected to an input of the first VCO 107. An output of the first VCO 107 and an output of the second VCO 111 as feedback are inputs to the second PLL 109. An output of the second PLL 109 is input to the second VCO 111. The output of the second VCO 111 is input to the first SYSREF/SYNC circuitry device 114. The output of the second VCO 111, an output of the first SYSREF/SYNC circuitry device 114, and a clock synchronization signal CLK_SYNC from the first beamforming device 115 are input to the first distribution device 113.

The output of the second VCO 111 is output to a divider and delay in the first distribution device 113 to generate a SYSREF frequency that is then split to many system reference clock signals (e.g., SDCLKs). The output of the second VCO 111 is also split to multiple dividers in the first distribution device 113 configured to desired device clock signals (e.g., DCLKs). A DCLK is configured to provide a reference clock frequency to an RF PLL device to generate an ADC sampling clock and another DCLK is configured for the reference clock frequency to an RF PLL device to generate a DAC sampling clock. From the output of the second VCO 111, the first distribution device 113 generates and outputs RF sample clock signal for an ADC RF_SAMP_CLK_ADC, a phase-locked clock signal PL_CLK, a system reference clock signal SYS_REF, a phase-locked system reference signal PL_SYS_REF, an ADC reference signal ADC_REF, a DAC reference signal DAC_REF, an RF sample clock signal for a DAC RF_SAMP_CLK_DAC, and the zero-delay path signal ZERO_DELAY_PATH. In an embodiment of the present disclosure, the first PLL 105, the first VCO 107, the second PLL 109, the second VCO 111, the first SYSREF/SYNC circuitry device 114, and the first distribution device 113 may be realized by a dual PLL and clock distribution device (e.g., Texas Instruments commercial component number LMK04828B) and two RF PLL devices (where each PLL device may be a Texas Instruments commercial component number LMX2594). The LMK04828B and the two LMX2594 devices may be realized by a Texas Instruments commercial device referred to as a CLK104 Add-On Module.

In an embodiment, a greatest common divisor (GCD) between input and output frequencies may equal an input frequency (e.g., GCD(CLKin Freq, CLKout Freq)=CLKin Freq). The lowest output frequency requiring determinism may be used for zero delay feedback. When multiple outputs require determinism, the frequency may be the GCD(Freq1, Freq2, . . . , FreqN). This is the frequency which then may be used as the clock output frequency for when GCD(CLKin Freq, CLKout Freq)=CLKin Freq.

The first clock domain device 104 distributes a stable frequency reference input that anchors an architecture for synchronizing multiple independent clock domains. Configuration clock devices in ZDM establish phase determinism between references and device clock outputs. One pulse per second (PPS) resets device clock dividers on the first distribution device 113 at system bootup. A one PPS pulse may be used as a SYNC trigger. A SYSREF, when commanded and a SYNC is active, goes through SYSREF/SYNC circuitry 114 as a pulse train and all the dividers in the first distribution device 113 are reset. The SYSREF pulse train is used to synchronize all the NCOs in the beamforming device 115 by resetting the count to zero. Dividers in the first distribution device 113 set frequencies of the outputs. The output of the second VCO 111 is divided to obtain signals of desired frequencies. The ZERO_DELAY_PATH feedback is after the dividers. The first SYSREF/SYNC circuitry device 114 may pulse SYSREF and reset all the dividers in the first distribution device 113.

The first beamforming device 115 receives the RF_SAMP_CLK_ADC signal, the PL_CLK signal, the SYS_REF signal, the PL_SYS_REF signal, the ADC_REF signal, the DAC_REF signal, and the RF_SAMP_CLK_DAC signal from the first distribution device 113. The first beamformer device 115 also has a data capture trigger bidirectional input/output DATA CAPTURE TRIGGER, a partial beam stream bus bidirectional input/output PARTIAL BEAM STREAM BUS, RF inputs for receiving RF signals, RF outputs for outputting RF signals, calibration input signals CALIBRATION, a control input signal CTRL, and an input/output at which a complex data stream is output or received. Complex data stream output has been digitally beamformed and complex data stream received is to be digitally beamformed for transmit. In an embodiment, the first beamforming device 115 is configured as a controlling (e.g., "parent") device and the n−1 beamforming devices (e.g., second beamforming device 127) are configured as controlled (e.g., "child") devices. The parent beamforming device outputs the DATA CAPTURE TRIGGER to the child beamforming devices. However, the present disclosure is not limited thereto. Any of the beamforming devices may be configured as the parent beamforming device while the other beamforming devices are configured as children beamforming devices. In the first beamforming channel device 102, the DATA CAPTURE TRIGGER provides an output signal. However, the present disclosure is not limited thereto, and the DATA CAPTURE TRIGGER may be provided by any of the n beamforming channel devices. For each received RF signal (e.g., n RF signals), each RF signal is received by an ADC, the output of each ADC is digitally down-converted by a DDC, each DDC produces in-phase (I) and quadrature (Q) signals, each set of I and Q signals are input to a beamforming device (e.g., a field programmable gate array (FPGA)) to form a beam. To transmit n RF signals, a beamforming device outputs n sets of I and Q signals, each set of I and Q signals is digitally up-converted by a DUC, the output of each DUC is provided to a DAC, and each DAC outputs an RF signal.

I and Q samples provided to DACs or provided by ADCs occur internally to an FPGA in the beamforming devices 115 and 127.

For transmit beamforming, I and Q data samples are received from a source, split n ways (e.g., n is the number of beamforming channel devices 102 and 112, i.e., DACs connected to elements) for n streams of I and Q data, beamforming weights are applied to each of the I and Q data streams/beamforming channel devices 102 and 112 based on azimuth and calibration adjustments of each beamforming channel device 102 and 112. Each DAC connected to an element in an antenna array receives a beamformed I+Q data stream, digitally interpolates, digitally upconverts and converts the digital sample data into an analog RF signal. When digitally upconverted the I and Q are added together to create a real digital sample signal. Together all the DACs are provided the I+Q samples that result in a formed beam transmitted through the antenna array.

For receive beamforming, the opposite occurs. An RF signal becomes incident to each element in an antenna array. Signal energy on each element is passed over a coaxial cable to each of the ADCs attached. Each of the ADCs sample the signal which becomes digital samples. These samples are digitally down converted (e.g., lower frequency and sample decimation). I+Q samples from each ADC arrive at their respective first-in-first-out registers (FIFOs) and made available to an FPGA of the beamforming devices 115 and 127. From the perspective of the FPGA, there are n I+Q data streams, where n is the number of ADC channels. Beamforming weights are applied to each of the I+Q data streams/channels based on azimuth and the calibration adjustments of the respective beamforming channel devices 102 and 112. For a single beamforming device the I+Q streams are summed to form a partial beam stream. When there is only one beamforming device, this is the final beam solution and, therefore, is output as a single stream of formed I+Q data to a destination signal data processing terminal. Otherwise, for more than one beamforming (BF) device, the partial beam data stream is provided to the other beamforming devices. A beamforming device is configured to form a single full beam and, therefore, is responsible for collecting partial beam streams from the other beamforming devices (e.g., the participating beamforming devices) and summing with its own partial beam I+Q data. This full beamformed data solution is forwarded to signal data processor. Multiple beams indicate full beam formed I+Q data from multiple beamforming devices.

A second output of the fanout device 103 provides a frequency reference signal to a second local clock domain 116 comprising a third PLL 117 identical to the first PLL 105, a third VCO 119 identical to the first VCO 107, a fourth PLL 121 identical to the second PLL 109, a fourth VCO 123 identical to the second VCO 111, a second SYSREF/SYNC circuitry device 124 identical to the first SYSREF/SYNC circuitry device 114, and a second distribution device 125 identical to the first distribution device 113. A second beamforming channel device 112 includes the second clock domain 116 identical to the first clock domain 104 (i.e., the third PLL 117, the third VCO 119, the fourth PLL 121, the fourth VCO 123, the second distribution device 125, the second SYSREF/SYNC circuitry device 124) and a second beamforming device 127 identical to the first beamforming device 115. Each of the beamforming devices 115 and 127 may output a beam or output a partial beam stream to another beamforming device. That is, the beamforming devices 115 and 127 work in a coherent fashion to form a beam. All partial beam solutions are summed to form the beam. One of the beamforming devices 115 and 127 (e.g., the parent) is chosen to sum all the partial beam solutions that form a particular beam (upon a receive beam) and vice-versa for a transmit beam.

The third PLL 117 receives the frequency reference signal from the second output of the fanout device 103 and a zero-delay-path signal ZERO_DELAY_PATH from the second distribution device 125. An output of the third PLL 117 is connected to an input of the third VCO 119. An output of the third VCO 119 and an output of the fourth VCO 123 are input to the fourth PLL 121. An output of the fourth PLL 121 is input to the fourth VCO 123. The output of the fourth VCO 123 is input to the second SYSREF/SYNC circuitry device 124. The output of the fourth VCO 123, the output of the second SYSREF/SYNC circuitry device 124 and a clock synchronization signal CLK_SYNC from the second beamforming device 127 are input to the second distribution device 125.

From the output of the fourth VCO 123 and the second SYSREF/SYNC circuitry device 124, the second distribution device 125 generates and outputs an RF sample clock signal for an ADC RF_SAMP_CLK_ADC, a programmable logic clock signal PL_CLK, a system reference clock signal SYS_REF, a phase-locked system reference signal PL_SYS_REF, an ADC reference signal ADC_REF, a DAC reference signal DAC_REF, an RF sample clock signal for a DAC RF_SAMP_CLK_DAC, and the zero-delay path signal ZERO_DELAY_PATH. PL_CLK goes to an FPGA. In an embodiment of the present disclosure, the third PLL 117, the third VCO 119, the fourth PLL 121, the fourth VCO 123, the second SYSREF/SYNC circuitry device 124, and the second distribution device 125 may be realized by a dual PLL and clock distribution device (e.g., Texas Instruments commercial component number LMK04828B) and two PLL devices (where each PLL device may be a Texas Instruments commercial component number LMX2594). The LMK04828B and the two LMX2594 devices may be realized by a Texas Instruments commercial device referred to as a CLK104 Add-On Module.

SYS_REF is local on the second distribution device 125. The synchronization method is zero delay with SYS_REF as a reference frequency. A beamforming channel device configured to operate in zero-delay mode with a SYS_REF divider included in a feedback loop allows the first PLL phase detector to lock the phase of the reference to the feedback divider. Because the reference is the SYS_REF frequency and the feedback divider outputs the SYS_REF frequency, the PLL will lock with the phases of the reference and the SYS_REF dividers match. Because the same reference is fanned out to multiple beamforming channels, the phase of the SYS_REF divider and all device clock (DCLK) dividers will be in phase by the closed loop zero-delay mode. Dividers in the second distribution device 124 set frequencies of the outputs. The ZERO_DELAY_PATH feedback is after the dividers. The second SYSREF/SYNC circuitry device 124 may pulse SYSREF and reset all the dividers in the second distribution device 125.

When all of the PLLs are locked, all SYS_REF clocks and clocks which have a GCD(SYS_REF Frequency, ClockFrequency) equal to SYS_REF Frequency, provided SYS_REF Frequency is less than Clock Frequency, will have deterministic phase with each other. The zero-delay feature using SYS_REF dividers as feedback may require all SYS_REF dividers outputs to be in phase if the PLLs are to be locked.

The second beamforming device 127 receives the RF_SAMP_CLK_ADC signal, the PL_CLK signal, the SYS_REF signal, the PL_SYS_REF signal, the ADC_REF signal, the DAC_REF signal, and the RF_SAMP_CLK_DAC signal from the second distribution device 125. The second beamforming device 127 also has a data capture trigger bidirectional input/output DATA CAPTURE TRIGGER, a partial beam stream bus bidirectional input/output PARTIAL BEAM STREAM BUS connected to the PARTIAL BEAM STREAM BUS input/output signal from the first beamforming device 115, RF inputs for receiving RF signals, RF outputs for outputting RF signals, calibration inputs CALIBRATION, a control input CTRL, and an input/output at which a complex data stream is output or a beam is received. Complex data stream output has been digitally beamformed and complex data stream received is to be digitally beamformed for transmit.

In the second beamforming channel device 112, the DATA CAPTURE TRIGGER is an input signal received from the DATA CAPTURE TRIGGER output signal from the first beamforming channel device 102. However, the present disclosure is not limited thereto. Any beamforming channel device may be configured to provide the DATA CAPTURE TRIGGER signal to the other beamforming channel devices.

Figure 1B:
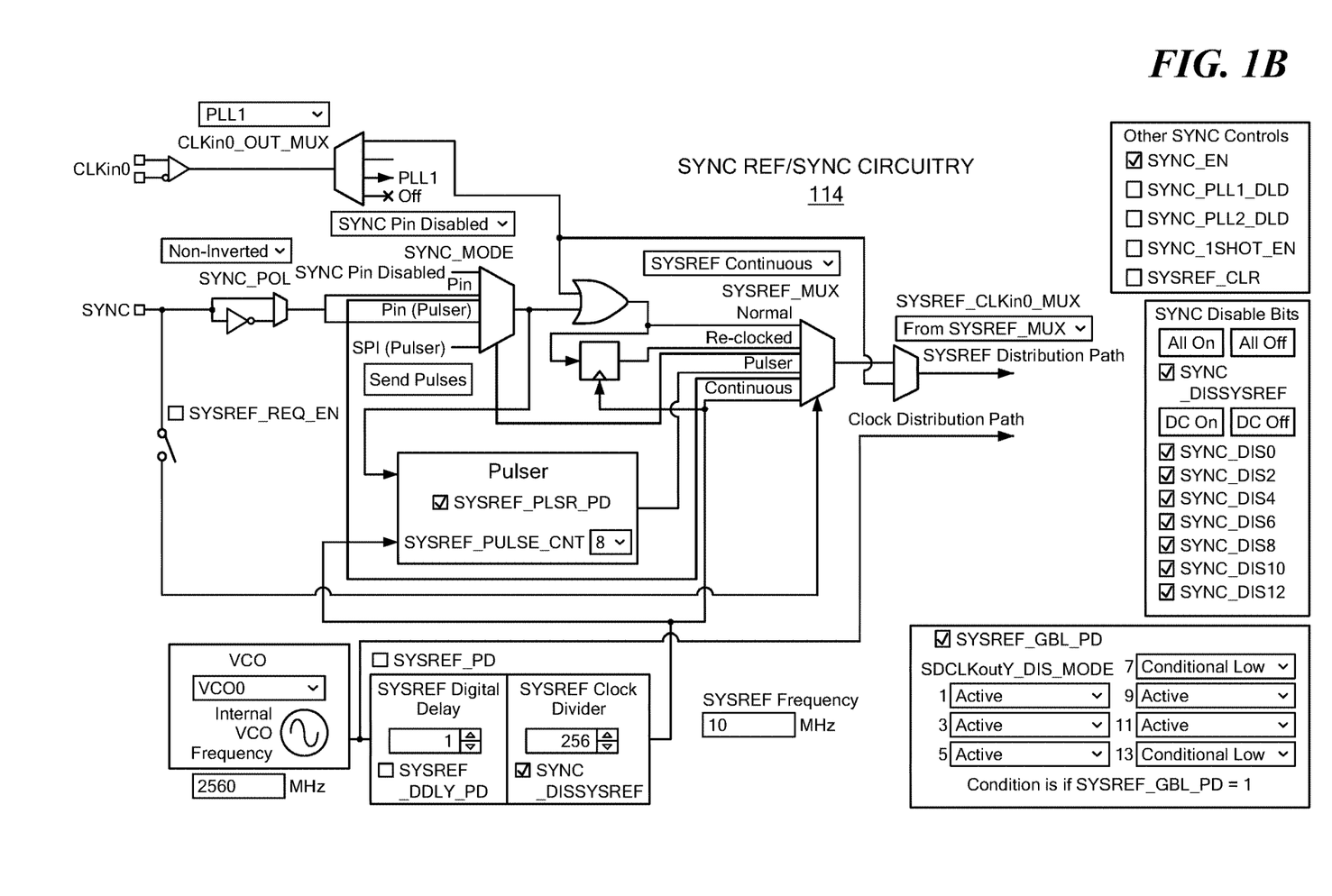
FIG. 1B is an illustration of an exemplary SYSREF/SYNC circuitry device of FIG. 1A.

FIG. 1B is an illustration of an exemplary SYSREF/SYNC circuitry device of FIG. 1A.

Figure 1C:
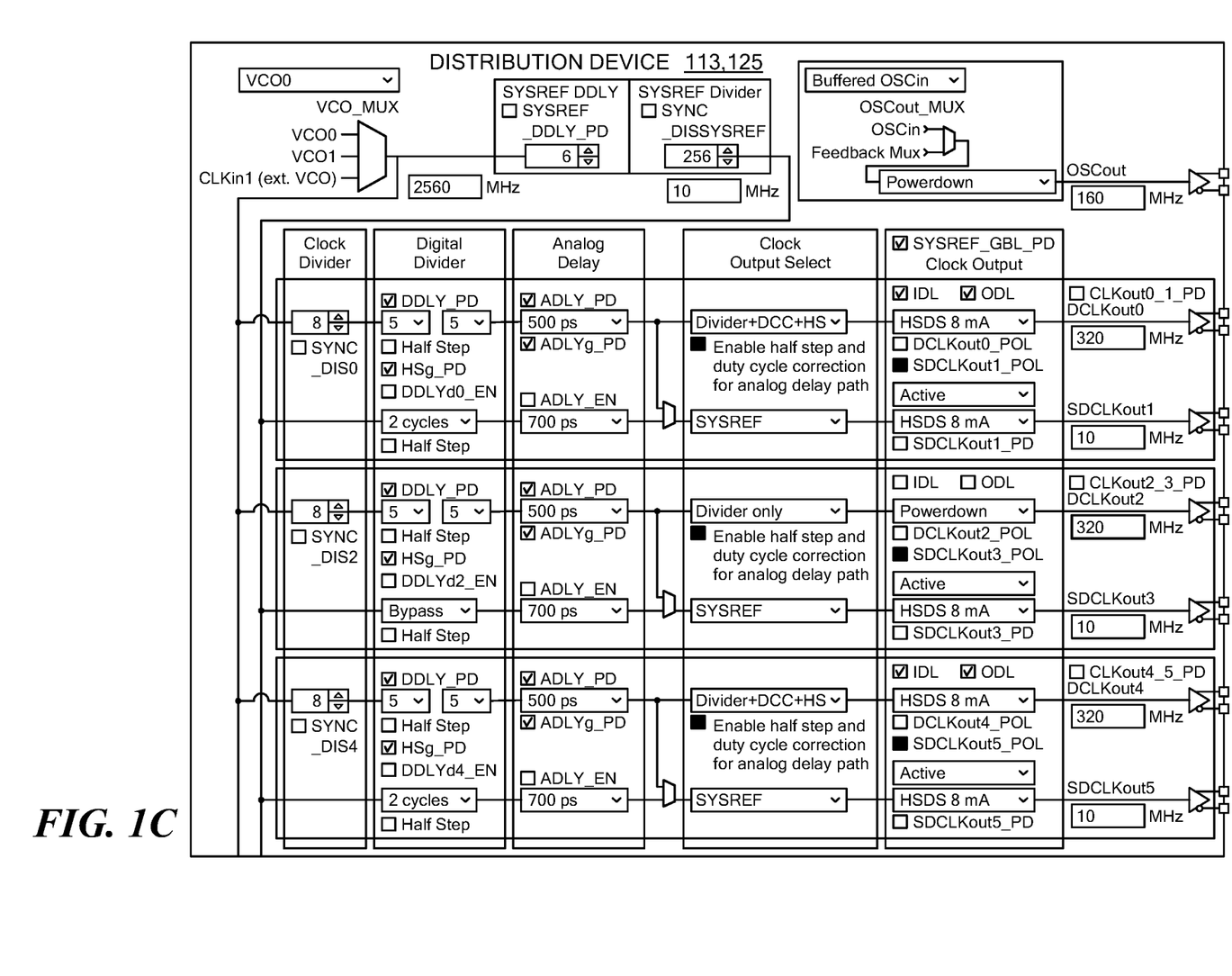
FIG. 1C is an illustration of an exemplary distribution device of FIG. 1A.

FIG. 1C is an illustration of an exemplary distribution device of FIG. 1A. When in synchronization, all dividers in the first and second distribution devices 113 and 125 are reset. SDCLK is equal to SYSREF.

Figure 2:
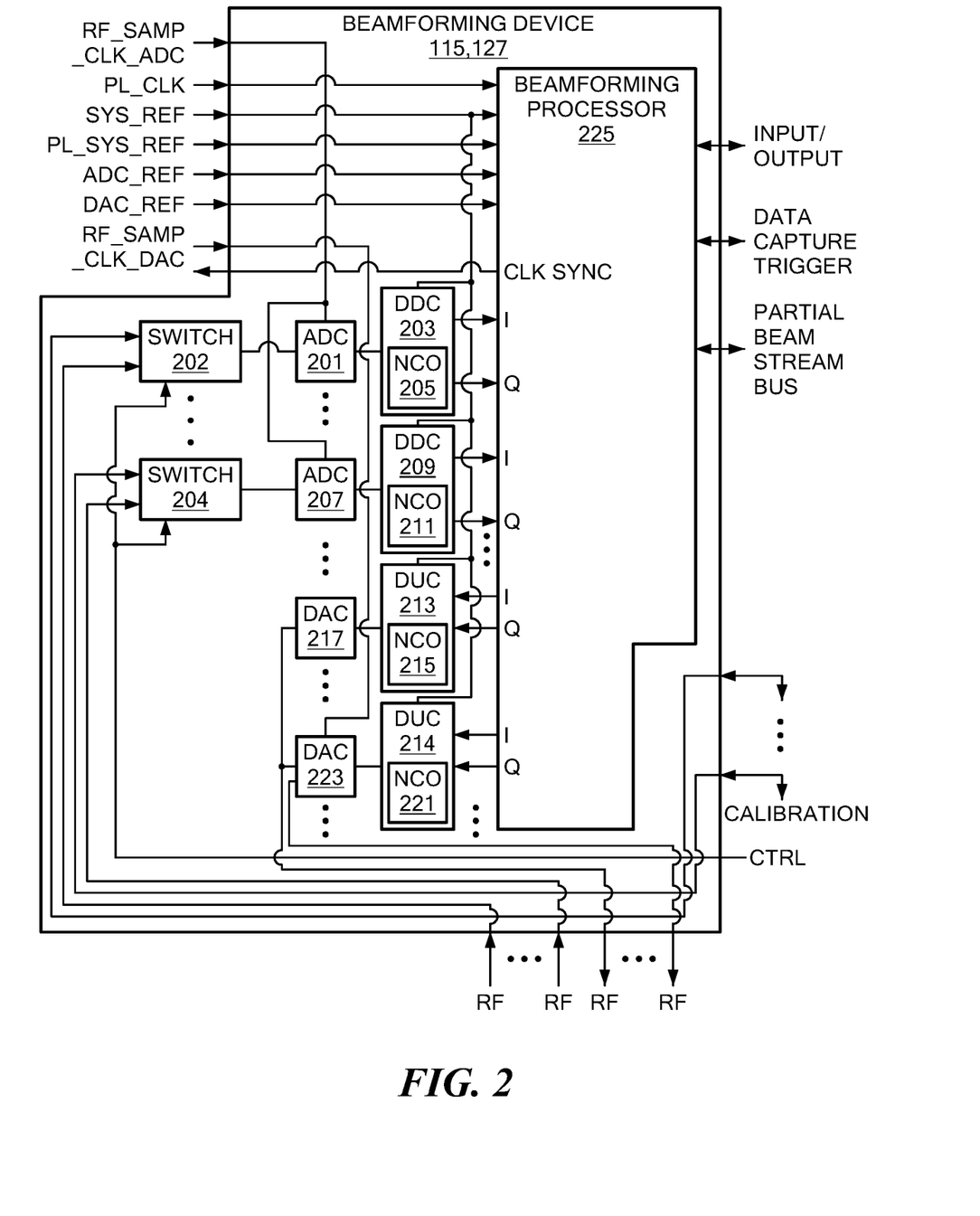
FIG. 2 is an illustration of a digital beamforming device of FIG. 1.

FIG. 2 is an illustration of a beamforming device 115, 127 of FIG. 1A.

In an example embodiment, the beamforming device 115, 127 includes n ADCs (e.g., a first ADC 201, a second ADC 207, etc.), n switches (e.g., switch 202, switch 204, etc.), n Data Down Converter (DDCs) devices (e.g., DDC 203, DDC 209, etc.) including a first set of n numerically-controlled oscillators (NCOs) (e.g., NCO 205, NCO 211, etc.), n Data Up Converter (DUCs) (e.g., DUC 213, DUC 214, etc.) including a second set of n NCOs (e.g., NCO 215, NCO 221, etc.), n DACs (e.g., DAC 217, DAC 223, etc.), and a beamforming processor 225. The count of each of the first NCO 205, the second NCO 211, the third NCO 215, and the fourth NCO 221 is reset at system bootup. However, the present disclosure is not limited thereto. The beamforming device 115, 127 may include n ADC, n DDCs, n DACs, and n DUCs, where n is equal to the number of RF signals. For example, n may be 4, 8, or any other suitable integer.

Each of the n switches (e.g., switch 202, switch 204, etc.) receives a control signal CTRL, one of the n RF inputs signals, and one of the n calibration signals, where n equals the number of ADCs in the beamforming device 115, 127. The control signal CTRL controls the n switches (e.g., switch 202, switch 204, etc.) to either output the calibration signals to the n ADCs (e.g., ADC 201, ADC 207, etc.) or output the n RF signals received to the n ADCs (e.g., ADC 201, ADC 207, etc.), respectively. The calibration signal is used to ensure that the beamforming device 115 and 127 is sufficiently calibrated, whereas the RF signals are used for beamforming. The n ADCs (e.g., ADC 201, ADC 207, etc.) receive the RF_SAMP_CLK_ADC input signal and receive either the RF input signals or the calibration signal from the n switches (e.g., switch 202, switch 204, etc.). The n ADCs (e.g., ADC 201, ADC 207, etc.) have outputs connected to inputs of the n DDCs (e.g., DDC 203, DDC 209, etc.), respectively. The SYS_REF input signal is connected to the n DDCs (e.g., DDC 203, DDC 209, etc.), the n DUCs (e.g., DUC 213, DUC 219, etc.), and the beamforming processor 225. I and Q outputs of the n DDCs (e.g., DDC 203, DDC 209, etc.) are connected to the beamforming processor 225. In an embodiment, output sampling clock signals for the n ADCs and the n DACs are received over phase matched 6-inch RF cables.

The PL_CLK, SYS_REF, PL_SYS_REF, ADC_REF, and DAC_REF input signals are connected to the beamforming processor 225.

The n DUCs (e.g., DUC 213, DUC 219, etc.) receive the SYS_REF input signal and receive I and Q input signals from the beamforming processor 225, respectively. The n DUCs (e.g., DUC 213, DUC 219, etc.) have outputs connected to inputs of the n DACs (e.g., DAC 217, DAC 223, etc.), respectively. The RF_SAMP_CLK_DAC input signal is connected to the n DACs (e.g., DAC 217, DAC 223, etc.). Outputs of the n DACs (e.g., DAC 217, DAC 223, etc.) are connected to the RF outputs of the first and second beamforming devices 115 and 127, respectively.

The beamforming processor 225 has a clock synchronization output signal CLK, a data capture trigger bidirectional input/output signal DATA CAPTURE TRIGGER, a partial beam stream bus bidirectional input/output signal PARTIAL BEAM STREAM BUS, and an input/output signal INPUT/OUTPUT. The beamforming processor 225 aligns all beamforming devices 115 and 127 with a first-in-first-out (FIFO) reset trigger (e.g., DATA CAPTURE TRIGGER) for sample alignment.

Figure 3:
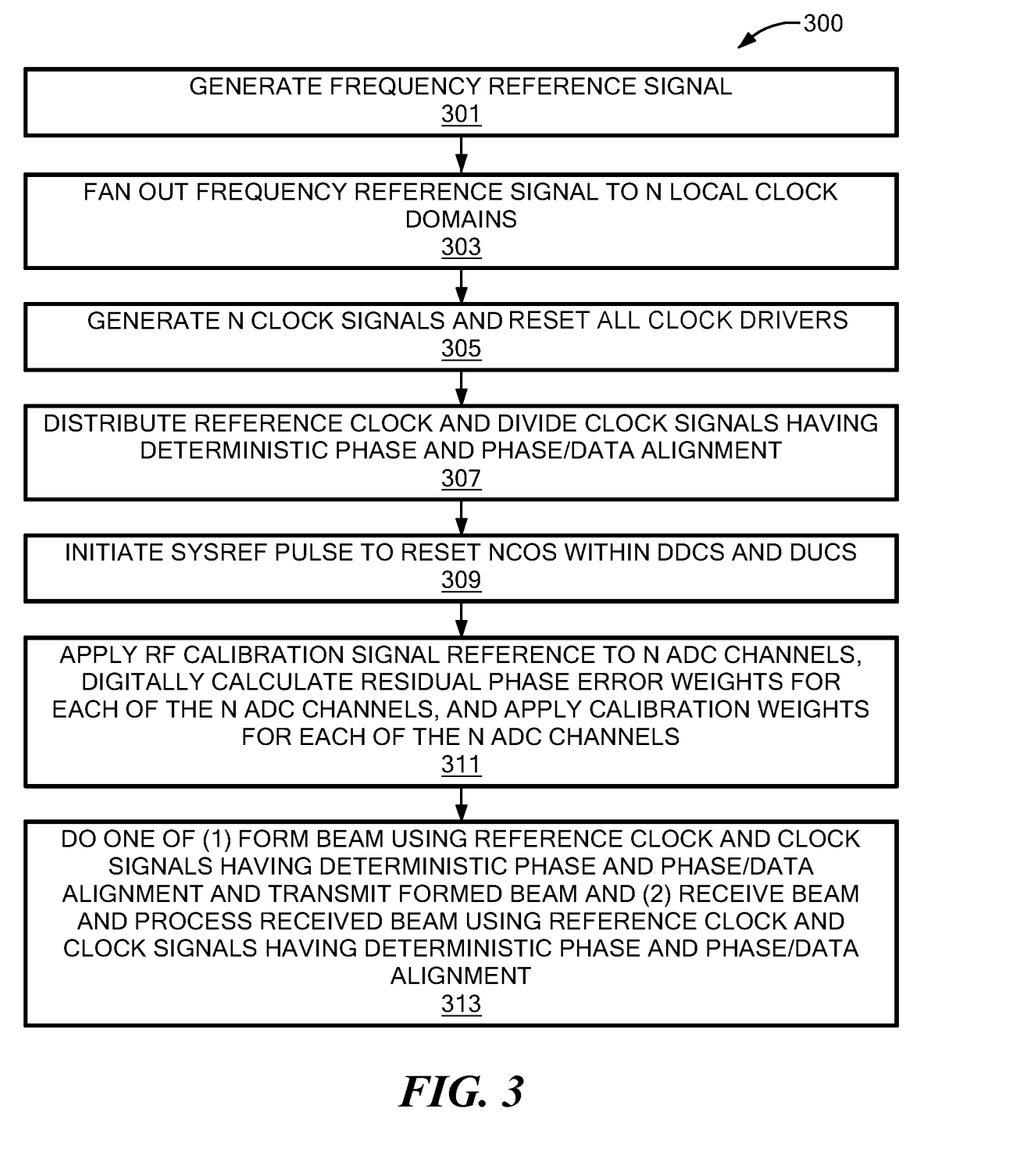
FIG. 3 is a flowchart of a method of synchronizing multiple beamforming devices of a multi-beam system of an embodiment of the concepts described herein.

FIG. 3 is a flowchart 300 of an embodiment of the concepts described herein.

Referring to FIG. 3, a method 300 of forming beams in a multi-beam system includes generating a frequency reference signal by a frequency reference device in step 301. A stable and accurate reference (e.g., the frequency reference signal) serves as the source for generating system references and device clock signals. The system references and device clock signals are distributed to beamforming devices.

Step 303 of the method 300 includes fanning out the frequency reference signal to n local clock domains by a fanout device, where n is a positive integer.

Step 305 of the method 300 includes generating n clock signals and resetting all clock drivers.

Step 307 of the method 300 includes distributing reference clock and device clock signals having deterministic phase and phase/data alignment.

Step 309 of the method 300 includes initiating a SYSREF pulse to reset NCOs within DDCs and DUCs.

Step 311 of the method 300 includes applying an RF calibration signal reference to n ADC channels, digitally calculating residual phase error weights for each of the n ADC channels, and applying calibration weights for each of the n ADC channels.

Step 313 of the method 300 includes doing one of (1) forming a beam using the reference clock and clock signals having deterministic phase and phase/data alignment and transmitting the formed beam and (2) receiving a beam and processing the received beam using the reference clock and clock signals having deterministic phase and phase/data alignment.

In an alternate embodiment of the present disclosure, the frequency reference device is a chip-scale atomic clock, where the frequency reference device outputs a 10 MHz clock signal, and where the frequency reference signal may be a sine wave.

In an alternate embodiment of the present disclosure, the fanout device is a dual phase-locked loop (PLL) and clock cleaner distribution device and each of the n beamforming devices is a radio frequency system-on-chip (RFSoC) device.

In an alternate embodiment of the present disclosure, each of the n local clock domain devices includes a first phase-locked loop (PLL) device, having a first input connected to one of the n outputs of the fanout device, a second input, and an output; a first voltage-controlled oscillator (VCO), having an input connected to the output of the first PLL device, and having an output; a second phase-locked loop (PLL) device, having a first input connected to the output of the first VCO, a second input, and an output; a second VCO, having an input connected to the output of the second PLL device, and having an output connected to the second input of the second PLL; and a distribution device, having a first input connected to the output of the second VCO, a second input configured to receive a clock synchronization signal, a first output connected to the second input of the first PLL and configured to provide a zero-delay path signal ZERO_DELAY_PATH, a second output configured to provide a radio frequency (RF) sample clock analog to digital (ADC) signal RF_SAMP_CLK_ADC, a third output configured to provide a phase-locked clock signal PL_CLK, a fourth output configured to provide a system reference signal SYS_REF, a fifth output configured to provide a programmable logic system reference signal PL_SYS_REF, a sixth output configured to provide an ADC reference signal ADC_REF, a seventh output configured to provide a digital to analog converter (DAC) reference signal DAC_REF, and an eighth output configured to provide an RF sample clock DAC signal RF_SAMP_CLK_DAC.

In an alternate embodiment of the present disclosure, each of the beamforming devices has seven inputs for receiving a radio frequency (RF) sample clock analog to digital (ADC) signal RF_SAMP_CLK_ADC, a phase-locked clock signal PL_CLK, a system reference signal SYS_REF, a programmable logic system reference signal PL_SYS_REF, an ADC reference signal ADC_REF, a digital to analog converter (DAC) reference signal DAC_REF, and an RF sample clock DAC signal RF_SAMP_CLK_DAC from a corresponding one of the n synchronization and distribution channel devices, a first output configured to output a clock synchronization signal CLK_SYNC to one of the n synchronization and distribution channel devices, n RF inputs for receiving RF signals, n RF outputs for outputting RF signals, a first bidirectional input/output configured to receive/provide a data capture trigger bidirectional input/output signal DATA CAPTURE TRIGGER, a second bidirectional input/output configured to receive/provide a partial beam stream bus signal PARTIAL BEAM STREAM BUS, a second input/output configured to provide a complex data interface, n inputs for receiving calibration injection input signals CALIBRATION, and an input for receiving a control signal CTRL.

In an alternate embodiment of the present disclosure, n equals 2 and the first bidirectional input/output of each of the n beamforming devices are connected to each other, and wherein the second bidirectional input/output of each of the n beamforming devices are connected to each other.

Figure 4A:
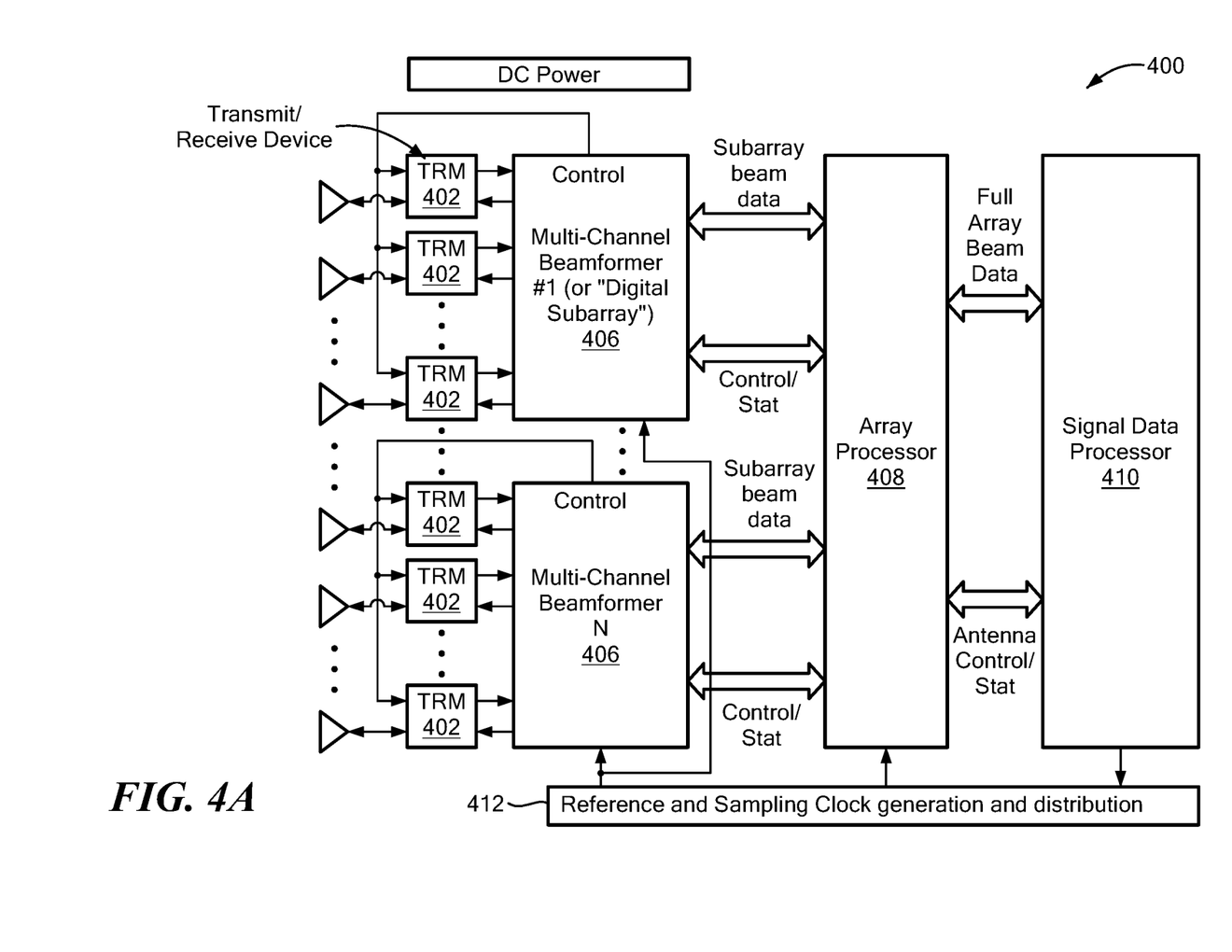
FIG. 4A is an illustration of an exemplary beamforming system.

FIG. 4A is an illustration of an exemplary digital beamforming system 400, according to embodiments of the disclosure. The illustrative system 400 includes separate transmit and receive devices (TRMs) 402. In other embodiments, the same system may be used for transmit and receive functions as is generally known. On the transmit side, the system 400 includes a multi-channel beamformers 406 (e.g., multi-channel beamformer #1 to multi-channel beamformer N, where N is a positive integer) connected to the transmit and receive devices 402 via inputs, outputs, and a control signal, and connected to an array processor 408. The array processor 408 is connected to a signal data processor 410. A reference and sampling clock generation and distribution device 412 receives a signal from the signal data processor 410 and transmits signals to each of the multi-channel beamformer devices 406 and the array processor 408.

Figure 4B:
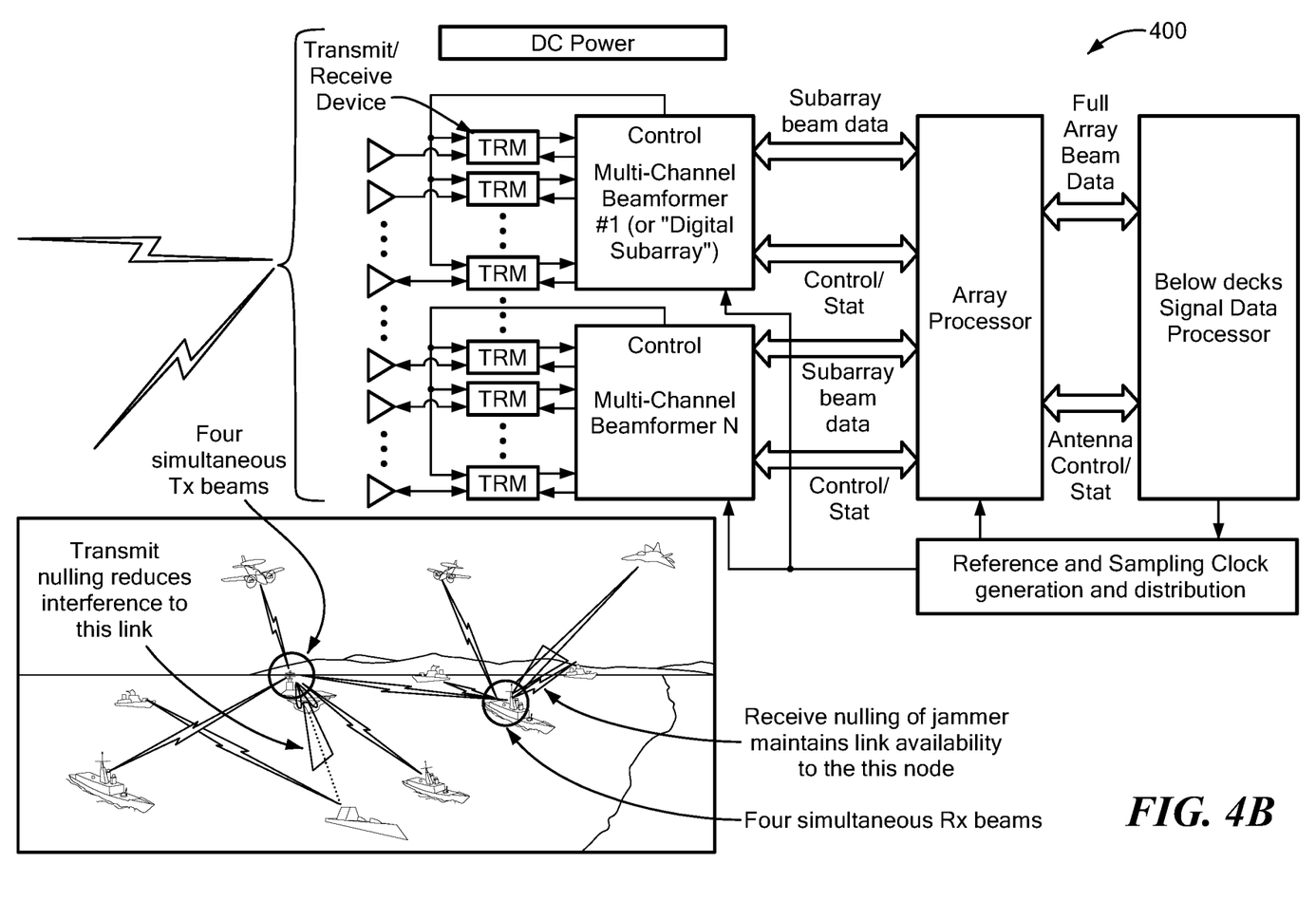
FIG. 4B is an illustration of an exemplary beamforming system and application.

FIG. 4B is an illustration of an exemplary beamforming system and application, according to embodiments of the disclosure. That is, the beamforming system 400 of FIG. 4A is applied to a naval application.

Figure 5:
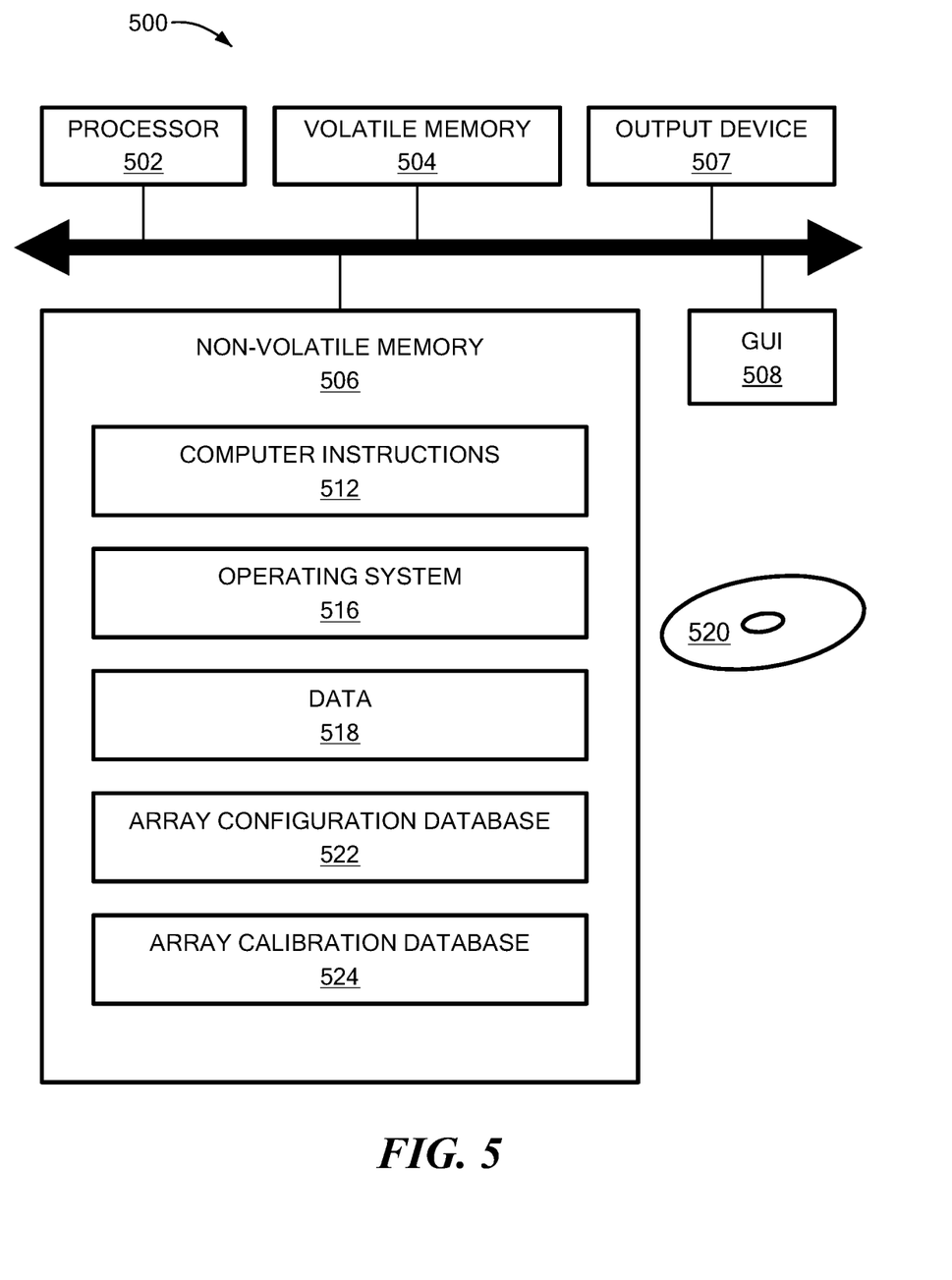
FIG. 5 is a schematic representation of an exemplary computer that may perform at least a portion of the processing described herein.

FIG. 5 shows an exemplary computer 500 that can perform at least part of the processing described herein. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions. In one embodiment, an array configuration database 522 and an array calibration database 524 are included in the non-volatile memory 506.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general-purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures and techniques sought to be protected are described herein with reference to the related drawings. As noted above, in embodiments, the concepts and features described herein may be embodied in a digital multi-beam beamforming system. Alternative embodiments can be devised without departing from the scope of the concepts, systems, devices, structures and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal," "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A multi-beam digital system, comprising:
   a frequency reference device configured to provide a frequency reference signal, wherein the frequency reference device has an output;
   a fanout device connected to the frequency reference device and configured to generate n frequency reference signals from the frequency reference signal from the frequency reference device, wherein the fanout device has n outputs configured to output the n frequency reference signals, respectively, where n is a positive integer;
   n local clock domain devices configured to synchronize the n frequency reference signals and distribute reference and clock signals having deterministic phase alignment and phase and data (phase/data) alignment; and
   n beamforming devices connected to the n clock domain devices, respectively, and configured to form a user-definable beam, having wherein the beamforming devices have n inputs configured to receive n radio frequency (RF) signals, respectively, and wherein the beamforming devices have n outputs for transmitting n RF signals, respectively.

2. The multi-beam digital system of claim 1, wherein the frequency reference device comprises a chip-scale atomic clock configured to provide a 10 MHz clock sine wave signal.

3. The multi-beam digital system of claim 1, wherein a greatest common divisor (GCD) between frequencies (Freq1, Freq2, . . . , FreqN) of clock signals having determinism comprises GCD(Freq1, Freq2, . . . , FreqN).

4. The multi-beam digital system of claim 1, wherein the fanout device comprises a dual phase-locked loop (PLL) and clock cleaner distribution device and each of the n beamforming devices comprises a radio frequency system-on-chip (RFSoC) device.

5. The multi-beam digital system of claim 1, wherein each of the n local clock domain devices comprises:
   a first phase-locked loop (PLL) device, having a first input connected to one of the n outputs of the fanout device, a second input, and an output;
   a first voltage-controlled oscillator (VCO), having an input connected to the output of the first PLL device, and having an output;
   a second phase-locked loop (PLL) device, having a first input connected to one of the n outputs of the fanout device, a second input, and an output;
   a second VCO, having an input connected to the output of the second PLL device, and having an output connected to the second input of the second PLL;

a system reference and synchronization (SYSREF/SYNC) circuitry device, having an input connected to the output of the second VCO, and having an output; and a distribution device, having a first input connected to the output of the second VCO, a second input configured to receive a clock synchronization signal, a third input connected to the output of the SYSREF/SYNC circuitry device, a first output connected to the second input of the first PLL and configured to provide a zero-delay path signal ZERO_DELAY_PATH, a second output configured to provide an RF sample clock analog to digital (ADC) signal RF_SAMP_CLK_ADC, a third output configured to provide a programmable logic clock signal PL_CLK, a fourth output configured to provide a system reference signal SYS_REF, a fifth output configured to provide a programmable logic system reference signal PL_SYS_REF, a sixth output configured to provide an ADC reference signal ADC_REF, a seventh output configured to provide a digital to analog converter (DAC) reference signal DAC_REF, and an eighth output configured to provide an RF sample clock DAC signal RF_SAMP_CLK_DAC.

6. The multi-beam digital system of claim 5, further comprising phase-matched RF cables on the second output of the distribution device configured to provide the RF_SAMP_CLK_ADC signal and the eighth output of the distribution device configured to provide the RF_SAMP_CLK_DAC signal.

7. The multi-beam digital system of claim 1, wherein each of the beamforming devices has seven inputs configured to receive an RF sample clock analog to digital (ADC) signal RF_SAMP_CLK_ADC, a phase-locked clock signal PL_CLK, a system reference signal SYS_REF, a programmable logic system reference signal PL_SYS_REF, an ADC reference signal ADC_REF, a digital to analog converter (DAC) reference signal DAC_REF, and an RF sample clock DAC signal RF_SAMP_CLK_DAC from a corresponding one of the n local clock domain devices, a first output configured to output a clock synchronization signal CLK_SYNC to one of the n local clock domain devices, n inputs configured to receive n calibration injection signals CALIBRATION, an input to receive a control signal CTRL, n RF inputs configured to receive RF data, n RF outputs for transmitting RF data, a first bidirectional input and output (input/output) configured to receive and provide (receive/provide) a data capture trigger bidirectional input/output signal DATA CAPTURE TRIGGER, a second bidirectional input/output configured to receive/provide a partial beam stream bus signal PARTIAL BEAM STREAM BUS; and an input/output for outputting a complex data stream.

8. The multi-beam digital system of claim 7, wherein each of the beamforming devices comprises:

n switches, having n inputs configured to receive the n calibration signals CALIBRATION, respectively, having an input for receiving the control signal CTRL, n inputs for receiving the n RF signals, and n outputs for outputting one of the n CALIBRATION signals and one of the n RF signals under control of the control signal CRTL;

n ADC devices, wherein each ADC device has a first input configured to receive the RF_SAMP_CLK_ADC signal, a second input connected to one of the n outputs of the n switches, and an output;

n data down converting devices (DDCs), wherein each DDC device has a first input configured to receive the SYS_REF signal, a second input connected to the output of one of the n ADC devices, an I output, and a Q output, wherein each DDC device comprises a numerically-controlled oscillator (NCO) resettable upon bootup;

n data up converting devices (DUCs), wherein each DUC device has a first input configured to receive the SYS_REF signal, a second input, a third input, and an output, wherein each DUC device comprises a numerically-controlled oscillator (NCO) resettable upon bootup;

n DAC devices, wherein each DAC device has a first input configured to receive the RF_SAMP_CLK_DAC signal, a second input connected to one of the n outputs of the n DUC devices, and an output connected to one of the n RF outputs; and a beamforming processor having five inputs configured to receive the PL_CLK signal, the SYS_REF signal, the PL_SYS_REF signal, the ADC_REF signal, and the DAC_REF signal, respectively; having a clock synchronization output configured to provide the CLK_SYNC signal; having 2n inputs configured to receive n I and n Q signals from the n DDC devices, respectively; having 2n outputs configured to provide n I signals and n Q signals to the n t DUC devices, respectively; having a first bidirectional input/output configured to receive/provide the DATA CAPTURE TRIGGER signal; having a second bidirectional input/output configured to receive/provide the PARTIAL BEAM STREAM BUS signal; and having a third bidirectional input/output configured to provide a complex data stream signal.

9. The multi-beam system of claim 1, wherein n equals 2.

10. The multi-beam digital system of claim 7, wherein the first bidirectional input/output of each of the n beamforming devices are connected to each other, and wherein the second bidirectional input/output of each of the n beamforming devices are connected to each other.

11. A method of forming a beam in a multi-beam digital system, the method comprising:

generating a frequency reference signal by a frequency reference device;

fanning out the frequency reference signal to n local clock domain devices, wherein n is a positive integer by a fanout device;

generating n clock signals and resetting clock dividers;

distributing a reference clock and dividing clock signals of the clock signals that have deterministic phase and phase and data (phase/data) alignment;

doing one of (1) forming a beam by n beamforming devices using the reference clock and the divided clock signals of the clock signals that have deterministic phase and phase/data alignment and transmitting a formed beam and (2) receiving a beam and processing the beam using the reference clock and the divided clock signals of the clock signals that have deterministic phase and phase/data alignment;

initiating a system reference (SYSREF) pulse and resetting numerically-controlled oscillators (NCOs) within data down converters (DDCs) and data up converters (DUCs); and applying a radio frequency (RF) calibration signal reference to n analog-to-digital converter (ADC) channels and applying calibration weights for each of the n ADC channels.

12. The method of claim 11, wherein the frequency reference device comprises a chip-scale atomic clock configured to provide a 10 MHz sine wave reference signal.

13. The method of claim 11, wherein a greatest common divisor (GCD) between frequencies (Freq1, Freq2, . . . , FreqN) of clock signals having determinism comprises GCD(Freq1, Freq2, . . . , FreqN).

14. The method of claim 11, wherein the fanout device comprises a dual phase-locked loop (PLL) and clock cleaner distribution device and each of the n beamforming devices comprises a radio frequency system-on-chip (RFSoC) device.

15. The method of claim 11, wherein each of the n local clock devices comprises:
- a first phase-locked loop (PLL) device, having a first input connected to one of the n outputs of the fanout device, a second input, and an output;
- a first voltage-controlled oscillator (VCO), having an input connected to the output of the first PLL device, and having an output;
- a second phase-locked loop (PLL) device, having a first input connected to one of the n outputs of the fanout device, a second input, and an output;
- a second VCO, having an input connected to the output of the second PLL device, and having an output connected to the second input of the second PLL;
- a system reference and synchronization (SYSREF/SYNC) circuitry device, having an input connected to the output of the second VCO, and having an output; and
- a distribution device, having a first input connected to the output of the second VCO, a second input configured to receive a clock synchronization signal, a third input connected to the output of the SYSREF/SYNC circuitry device, a first output connected to the second input of the first PLL and configured to provide a zero-delay path signal ZERO_DELAY_PATH, a second output configured to provide an RF sample clock analog to digital (ADC) signal RF_SAMP_CLK_ADC, a third output configured to provide a programmable logic clock signal PL_CLK, a fourth output configured to provide a system reference signal SYS_REF, a fifth output configured to provide a programmable logic system reference signal PL_SYS_REF, a sixth output configured to provide an ADC reference signal ADC_REF, a seventh output configured to provide a digital to analog converter (DAC) reference signal DAC_REF, and an eighth output configured to provide an RF sample clock DAC signal RF_SAMP_CLK_DAC.

16. The method of claim 15, further comprising phase-matched RF cables on the second output of the distribution device configured to provide the RF_SAMP_CLK_ADC signal and the eighth output of the distribution device configured to provide the RF_SAMP_CLK_DAC signal.

17. The method of claim 11, wherein each of the beamforming devices has seven inputs configured to receive an RF sample clock analog to digital (ADC) signal RF_SAMP_CLK_ADC, a programmable logic clock signal PL_CLK, a system reference signal SYS_REF, a programmable logic system reference signal PL_SYS_REF, an ADC reference signal ADC_REF, a digital to analog converter (DAC) reference signal DAC_REF, and an RF sample clock DAC signal RF_SAMP_CLK_DAC from a corresponding one of the n local clock domain devices, a first output configured to output a clock synchronization signal CLK_SYNC to one of the n local clock domain devices, an input configured to receive n calibration injection signals CALIBRATION, an input for receiving a control signal CTRL, n RF inputs to receive RF data, n RF outputs bus configured to output RF data, a first bidirectional input and output (input/output) configured to receive and provide (receive/provide) a data capture trigger bidirectional input/output signal DATA CAPTURE TRIGGER, a second bidirectional input/output configured to receive/provide a partial beam stream bus signal PARTIAL BEAM STREAM BUS; and an input/output configured to provide a complex data stream signal.

18. The method of claim 17, wherein each of the beamforming devices comprises:
- n switches, wherein each of the n switches has an input for receiving one of the n CALIBRATION signals, an input for receiving the CTRL signal, and an input for receiving one of the n RF data signals;
- n ADC devices, wherein each ADC device has a first input configured to receive the RF_SAMP_CLK_ADC signal, a second input connected to one of the outputs of the n switches, and an output;
- n data down converting devices (DDCs), wherein each DDC device has a first input configured to receive the SYS_REF signal, a second input connected to the output of one of the n ADC devices, an I output, and a Q output, wherein each the DDC device comprises a numerically-controlled oscillator (NCO) resettable upon bootup;
- n data up converting devices (DUCs), wherein each DUC device has a first input configured to receive the SYS_REF signal, a second input, a third input, and an output, wherein each DUC device comprises a numerically-controlled oscillator (NCO) resettable upon bootup;
- n DAC devices, wherein each DAC device has a first input configured to receive the RF_SAMP_CLK_DAC signal, a second input connected to one of the outputs of the n DUC devices, and an output connected to one of the RF outputs; and
- a beamforming processor having five inputs configured to receive the PL_CLK signal, the SYS_REF signal, the PL_SYS_REF signal, the ADC_REF signal, and the DAC_REF signal, respectively; having a clock synchronization output configured to provide the CLK_SYNC signal; having 2n inputs configured to receive n I signals and n Q signals from the n DDC devices, respectively; having 2n outputs configured to provide n I signals and n Q signals to the n DUC devices, respectively; having a first bidirectional input/output configured to receive/provide the DATA CAPTURE TRIGGER signal; having a second bidirectional input/output configured to receive/provide the PARTIAL BEAM STREAM BUS signal; and having a third bidirectional input/output configured to provide a complex data stream signal.

19. The method of claim 11, wherein n equals 2.

20. The method of claim 17, wherein the first bidirectional input/output of each of the n beamforming devices are connected to each other, and wherein the second bidirectional input/output of each of the n beamforming devices are connected to each other.

* * * * *